United States Patent
Lee et al.

(10) Patent No.: US 10,663,871 B2
(45) Date of Patent: May 26, 2020

(54) RETICLE STAGE AND METHOD FOR USING THE SAME

(71) Applicant: Taiwan Semiconductor Manufacturing Co., Ltd., Hsinchu (TW)

(72) Inventors: Chia-Yu Lee, Hsinchu (TW); Tao-Hsin Chen, Tainan (TW); Chia-Hao Hsu, Hsinchu (TW); Ching-Juinn Huang, Changhua (TW); Po-Chung Cheng, Zhongpu Shiang (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/359,073

(22) Filed: Mar. 20, 2019

(65) Prior Publication Data
US 2020/0033717 A1    Jan. 30, 2020

Related U.S. Application Data

(60) Provisional application No. 62/711,673, filed on Jul. 30, 2018.

(51) Int. Cl.
*G03B 27/62* (2006.01)
*G03F 7/20* (2006.01)

(52) U.S. Cl.
CPC .......... *G03F 7/70708* (2013.01); *G03F 7/707* (2013.01); *G03F 7/709* (2013.01); *G03F 7/70841* (2013.01)

(58) Field of Classification Search
CPC ............. H01L 21/0332; H01L 21/0337; H01L 21/6831; H01L 21/3833; H01L 21/38; H01L 21/677; H01L 29/0649; G03F 1/24; G03F 1/40; G03F 7/70283; G03F 7/70691; G03F 7/707; G03F 7/70708; G03F 7/70733; G03F 7/70741; G03F 7/70758; G03F 7/70775; G03F 7/78; G03F 7/70808; G03F 7/70825; G03F 7/70841; G03F 7/709; G03F 7/7095; G03F 7/70975; G03F 7/70358; G03F 7/70783; G03F 7/70866; H02N 13/00
USPC ........................ 355/30, 52–55, 72–77; 430/5; 378/34–35; 250/492.1, 492.2, 492.22, 250/493.1

See application file for complete search history.

(56) References Cited

U.S. PATENT DOCUMENTS

| | | | | |
|---|---|---|---|---|
| 3,662,293 A * | 5/1972 | De Vries | ............ | H03H 9/02622 333/151 |
| 4,931,755 A * | 6/1990 | Sakamoto | ............ | H03H 9/6423 310/313 B |
| 5,530,616 A * | 6/1996 | Kitabayashi | ........ | H01L 21/6831 361/234 |

(Continued)

*Primary Examiner* — Christina A Riddle
(74) *Attorney, Agent, or Firm* — McClure, Qualey & Rodack, LLP

(57) ABSTRACT

A reticle stage is provided, including an electrostatic chuck and an acoustic wave transducer. The electrostatic chuck includes multiple chucking electrodes embedded in a dielectric body and configured to secure a reticle to a chuck surface of the dielectric body by electrostatic attraction. The acoustic wave transducer is disposed on the chuck surface and configured to impart a surface acoustic wave to the chuck surface to vibrate the chuck surface, thereby removing the reticle from the reticle stage.

20 Claims, 10 Drawing Sheets

(56) References Cited

U.S. PATENT DOCUMENTS

| | | | |
|---|---|---|---|
| 6,084,938 A * | 7/2000 | Hara | G03F 7/70708 |
| | | | 269/8 |
| 6,403,322 B1 * | 6/2002 | Fischer | G01N 29/12 |
| | | | 435/6.11 |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2006/0102849 A1 * | 5/2006 | Mertens | G03F 7/707 |
| | | | 250/440.11 |
| 2007/0113658 A1 * | 5/2007 | Combi | G01L 9/0025 |
| | | | 73/702 |
| 2009/0033907 A1 * | 2/2009 | Watson | G03B 27/62 |
| | | | 355/75 |
| 2018/0287583 A1 * | 10/2018 | Lee | H01L 21/6838 |

* cited by examiner

US 10,663,871 B2

RETICLE STAGE AND METHOD FOR USING THE SAME

CROSS REFERENCE TO RELATED APPLICATIONS

The present application claims priority of U.S. Provisional Patent Application No. 62/711,673, filed on Jul. 30, 2018, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering the associated costs. Such scaling down has also increased the complexity of IC processing and manufacturing.

For example, there is a growing need to perform higher-resolution lithography processes. One lithography technique is extreme ultraviolet lithography (EUVL). The EUVL technique employs scanners that use light in the extreme ultraviolet (EUV) region, having a wavelength of about 1-10 nm. Some EUV scanners provide 4 times reduction projection printing, similar to some optical scanners, except that the EUV scanners use reflective optics rather than refractive optics, i.e., mirrors instead of lenses.

EUV radiation is absorbed in virtually all transmissive materials, including gases and glasses. To minimize unwanted absorption and to avoid EUV intensity loss, EUV lithography patterning is maintained in a vacuum environment. Each lithography step may employ a reticle through which the pattern of a component of an integrated circuit is generated. The reticle stage used in EUV scanners typically uses electrostatic attraction instead of vacuum suction to secure reticles.

Although existing methods and devices for transporting reticles in EUV scanners during the lithography process have been adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1:
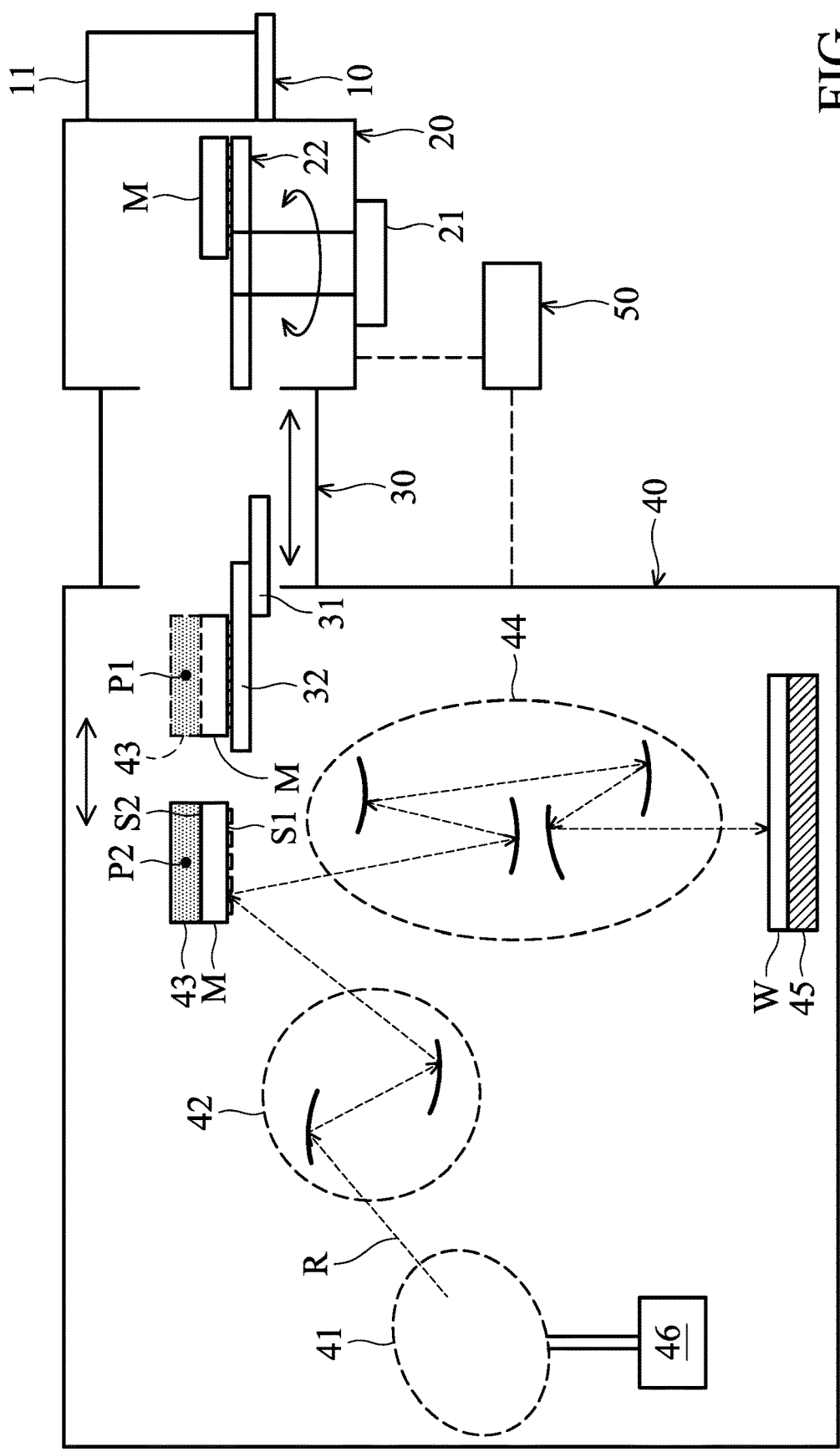
FIG. 1 is a schematic view of a semiconductor substrate processing system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic and diagrammatic view of a semiconductor substrate processing system 1, in accordance with some embodiments. In some embodiment, the semiconductor substrate processing system 1 includes a load port 10, a transferring module 20, a switching module 30, and a processing module 40. The elements of the semiconductor substrate processing system 1 can be added or omitted, and the invention should not be limited by the embodiments.

In some embodiments, the load port 10 is configured to load a reticle M from a carrier 11 to the semiconductor substrate processing system 1 or remove a reticle M from the semiconductor substrate processing system 1 to the carrier 11. In some embodiments, the load port 10 is able to place two carriers 11. One of the two carriers 11 is used to carry the reticle M which is going to be transported into the semiconductor substrate processing system 1, and another one is used to carry the reticle M which is removed from the semiconductor substrate processing system 1.

The transferring module 20 is configured to deliver the reticle M between the load port 10 and the switching module 30. In some embodiments, the transferring module 20 is positioned between the load port 10 and the switching module 30. The transferring module 20 may include a control circuit 21 and a robotic arm 22. The robotic arm 22 is controlled by the electrical signal outputted from the control circuit 21. In some embodiments, the robotic arm 22 includes a multi-axis robot manipulator and is configured for delivering the reticle M.

The switching module 30 is configured for grasping the reticle M before the reticle M is moved to a reticle stage 43 of the processing module 40 and after the reticle M is removed from the reticle stage 43. In some embodiments, the switching module 30 includes a robotic arm 31 configured to deliver the reticle M between the robotic arm 22 of the transferring module 20 and the reticle stage 43. During transportation, the reticle M is received on or within a reticle pod 32 grasped by the robotic arm 31. In some embodiments where the processing module 40 is an extreme ultraviolet (EUV) lithography system, the reticle pod 32 includes an EUV inner pod (EIP) that allows the reticle M to remain within a protective environment until the reticle M is moved into the processing module 40 and/or near the reticle stage 43.

In some embodiments, the processing module 40 is a lithography system. The lithography system may also be generically referred to as a scanner that is operable to perform lithography exposing processes with respective radiation source and exposure mode. In some embodiments, the processing module 40 is an EUV lithography system designed to expose a resist layer by EUV light (for illustration, the processing module 40 is also referred to as an EUV lithography system). The resist layer is a suitable material sensitive to EUV light. The EUV lithography system 40 employs a radiation source 41 to generate EUV light, such as EUV light having a wavelength ranging between about 1 nm and about 100 nm. In one particular example, the radiation source 41 generates EUV light with a wavelength centered at about 13.5 nm. Accordingly, the radiation source 41 is also referred to as an EUV radiation source 12. In some embodiments, the EUV radiation source 41 utilizes a mechanism of laser-produced plasma (LPP) to generate the EUV radiation R.

The EUV lithography system 40 also employs an illumination module 42. In various embodiments, the illumination module 42 includes various reflective optics, such as a single mirror or a mirror system having multiple mirrors, in order to direct light from the radiation source 41 onto the reticle stage 43 of the EUV lithography system 40, particularly to a reticle M secured on the reticle stage 43.

The reticle stage 43 is configured to secure the reticle M. In some embodiments, the reticle stage 43 includes an electrostatic chuck (e-chuck) to secure the reticle M. This is because that gas molecules absorb EUV light and the lithography system for the EUV lithography patterning is maintained in a vacuum environment to avoid the EUV intensity loss. In the present disclosure, the terms of mask, photomask, and reticle are used interchangeably.

In some embodiments, the reticle M is a reflective mask. One exemplary structure of the reticle M includes a substrate with a suitable material, such as a low thermal expansion material (LTEM) or fused quartz. In various examples, the LTEM includes $TiO_2$ doped $SiO_2$, or other suitable materials with low thermal expansion. The reticle M includes a reflective multiple layers (ML) deposited on the substrate. For example, the ML may include a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The reticle M may further include a capping layer, such as ruthenium (Ru), disposed on the ML for protection. The reticle M further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

As shown in FIG. 1, in the EUV lithography system 40, the reflective reticle M is held by the reticle stage 43 such that a patterned surface S1 of the reticle M faces downward and a chucked surface S2 of the reticle M opposite the patterned surface S1 faces the reticle stage 43.

The EUV lithography system 40 also includes a projection optics module (or projection optics box (POB)) 44 for imaging the pattern of the reticle M onto a semiconductor substrate W secured on a substrate stage 45 of the EUV lithography system 40. In some embodiments, the POB 44 has reflective optics for projecting the EUV light. The EUV light directed from the reticle M, which carries the image of the pattern defined on the reticle M, is collected by the POB 44. The illumination module 42 and the POB 44 are collectively referred to an optical module of the EUV lithography system 40.

In some embodiments, the semiconductor substrate W is a semiconductor wafer made of silicon or other semiconductor materials. Alternatively or additionally, the semiconductor substrate W may include other elementary semiconductor materials such as germanium (Ge). In some embodiments, the semiconductor substrate W is made of a compound semiconductor such as silicon carbide (SiC), gallium arsenic (GaAs), indium arsenide (InAs), or indium phosphide (InP). In some embodiments, the semiconductor substrate W is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor substrate W may be a silicon-on-insulator (SOI) or a germanium-on-insulator (GOI) substrate.

In addition, the semiconductor substrate W may have various device elements. Examples of device elements that are formed in the semiconductor substrate W include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the semiconductor substrate W is coated with a resist layer sensitive to the EUV light. Various components of the EUV lithography system 40 including those described above are integrated together and are operable to perform the lithography process.

For example, in some embodiments, when a reticle M is moved by the robotic arm 31 of the switching module 30 into the EUV lithography system 40, the reticle stage 43 is first moved by a driver (not shown) to a position P1 (also referred as a loading position) as shown in FIG. 1. In the loading position P1, the reticle stage 43 is positioned above the reticle M on the robotic arm 31. Then the reticle M is clamped onto the reticle stage 43 by electrostatic attraction and is moved to a position P2 (also referred to as a processing position) above the semiconductor substrate W for subsequent lithography processing. After the lithography process, the reticle stage 43 is moved to an unloading position that is the same as the loading position P1 shown in FIG. 1. In the unloading position, the electrostatic attraction is released, and the reticle M is removed from the reticle stage 43 and received by the robotic arm 31 to be sent out of the EUV lithography system 40 for further processing or storage.

Due to the residual electrostatic charge, when the electrostatic attraction of the reticle stage 43 is released, the reticle M can usually adhere onto the reticle stage 43. In other words, the removal of the reticle M from the reticle stage 43 may not be successful. It is therefore desirable to provide a novel reticle stage that has a reticle removal mechanism in order to facilitate removal of the reticle.

Figure 2:
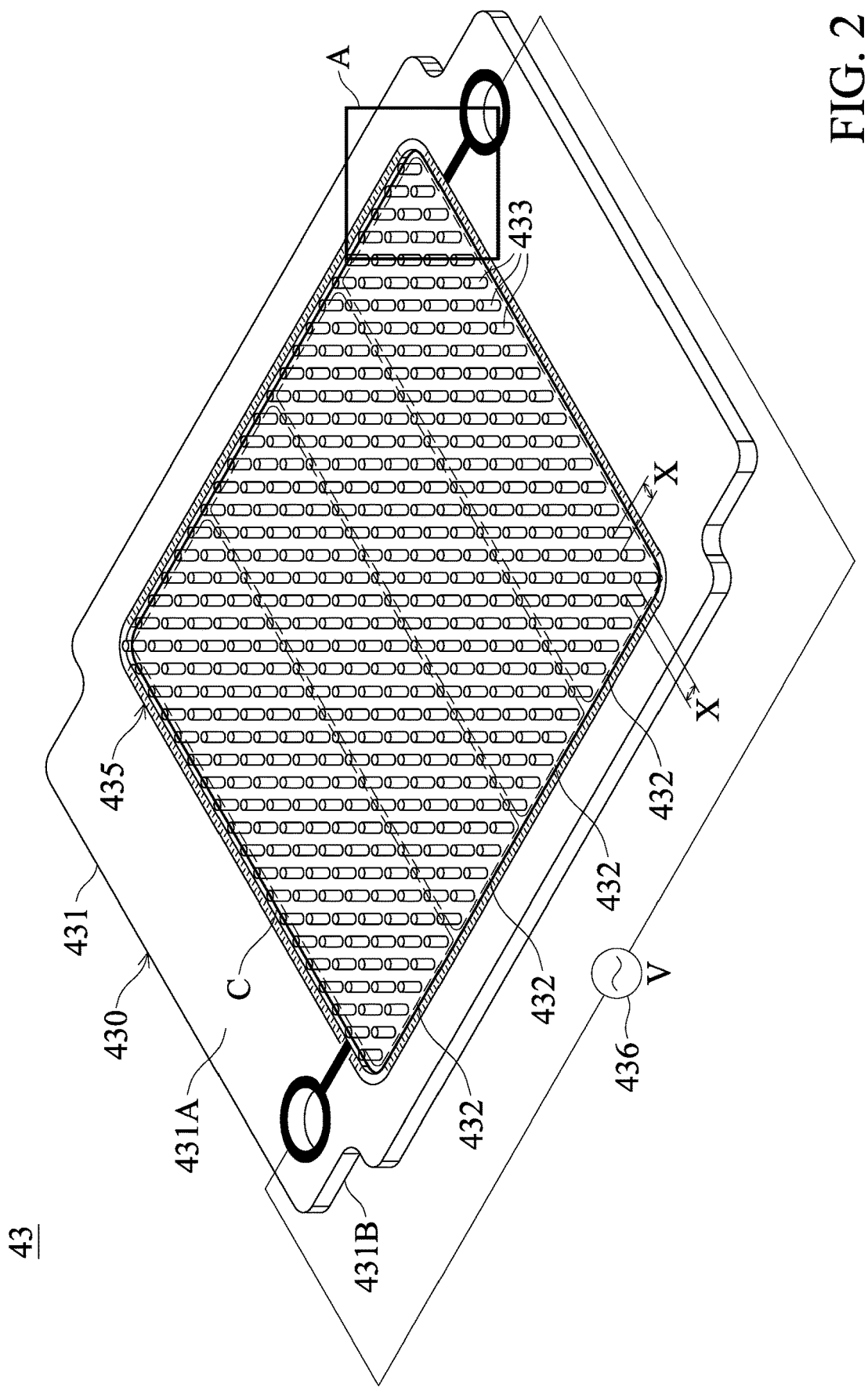
FIG. 2 is a perspective view of a reticle stage, in accordance with some embodiments.
Figure 3:
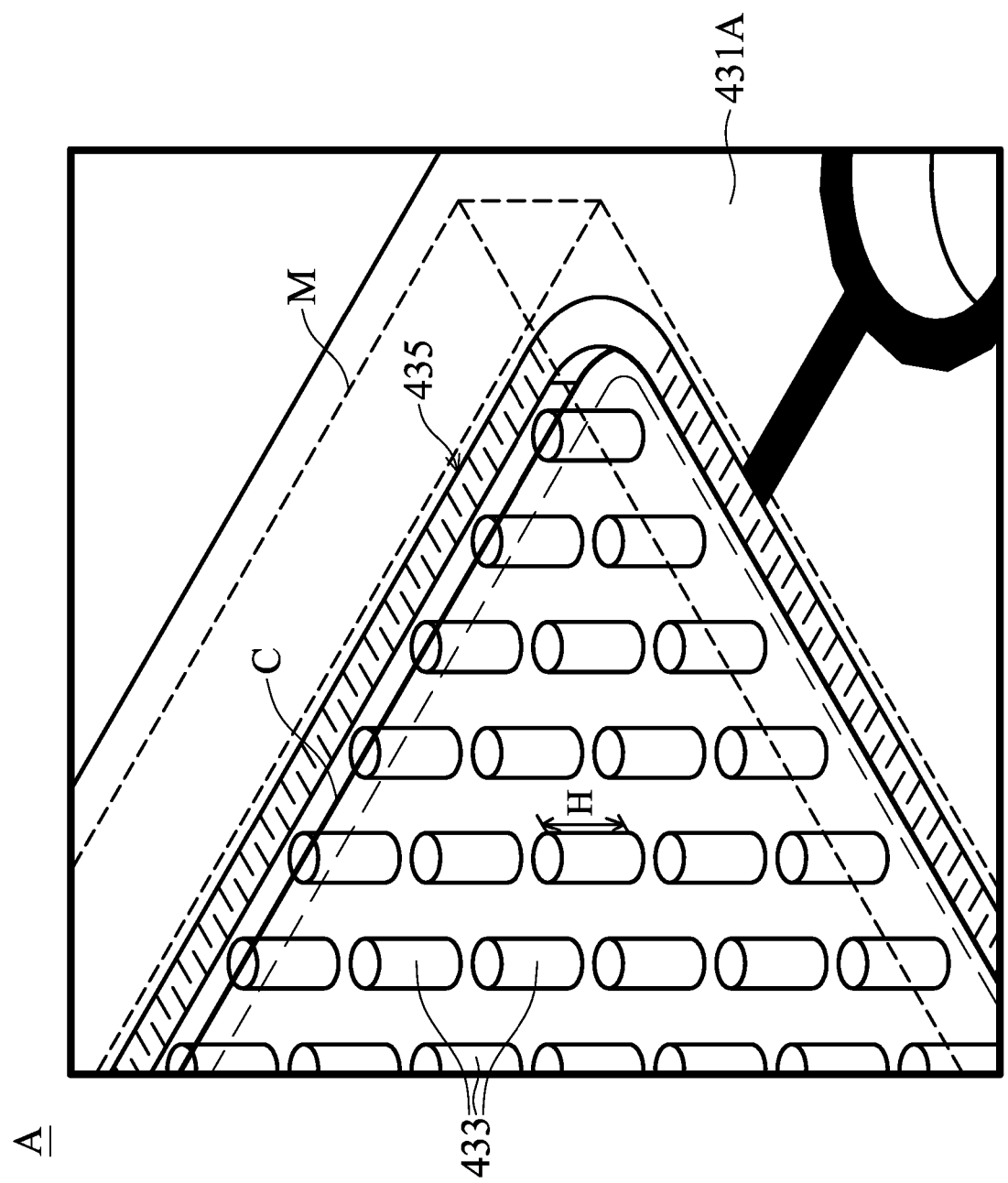
FIG. 3 is an enlarged view of the part A in FIG. 2, wherein the reticle on the reticle stage is depicted.

FIG. 2 is a perspective view of a reticle stage 43, in accordance with some embodiments. FIG. 3 is an enlarged view of the part A in FIG. 2, wherein the reticle M on the reticle stage 43 is depicted. In some embodiments, as shown in FIGS. 2 and 3, the reticle stage 43 includes an electrostatic chuck 430. The electrostatic chuck 430 may include a dielectric body 431 and a number of chucking electrodes 432 embedded in the dielectric body 431 (the chucking electrodes 432 inside the dielectric body 431 are depicted by the dashed line). In some embodiments, the electrostatic chuck 430 includes four chucking electrodes 432, as shown in FIG. 2. The number of the chucking electrodes 432 can vary in different embodiments.

The dielectric body 431 has a chuck surface 431A facing the chucked surface S2 of the reticle M (see FIG. 1) and a base surface 431B opposite the chuck surface 431A. The chucking electrodes 432, while receiving a voltage, provide electrostatic attraction to secure the reticle M on the chuck surface 431A. In some embodiments, the supplied voltage is about 1 kilovolt (kV) DC (direct-current). Other values of voltage can also be used.

The chucking electrodes 432 may be configured to stably secure the reticle M on the chuck surface 431A. In some embodiments, the chucking electrodes 432 are positioned in a central region C of the dielectric body 431, wherein the central region C has an area substantially equal to (e.g., slightly smaller than) the area of the reticle M, so that the reticle M can be stably secured on the chuck surface 431A.

The electrostatic chuck 430 also includes a number of protruding burls 433 formed on the chuck surface 431A. The protruding burls 433 are protruding or extending from the chuck surface 431A to support the reticle M and separate the reticle M from the chuck surface 431A, thereby preventing the reticle M from adhering to the chuck surface 431A. In some embodiments, the protruding burls 433 are arranged in the central region C of the chuck surface 431A in an array with a fixed spacing X between two neighboring protruding burls 433, such as about 3 mm. Other values of the spacing X between neighboring protruding burls 433 can also be used.

In some embodiments, each protruding burl 433 has a height H (see FIG. 3) of up to about 3 μm such that the electrostatic attraction provided by the electrostatic chuck 430 can successfully secure the reticle M on the chuck surface 431A. However, in some other embodiments, when a larger voltage (e.g., greater than about 1 kV) is supplied to the chucking electrodes 432, the vertical height H of each protruding burl 433 may also be greater than about 3 μm.

The reticle stage 43 also include at least one acoustic wave transducer 435 disposed on the chuck surface 431A of the dielectric body 431. The acoustic wave transducer(s) 435 is configured to impart a surface acoustic wave (SAW) (see FIG. 4) to the chuck surface 431A to vibrate the chuck surface 431A. Accordingly, the reticle M can be removed from the chuck surface 431A.

In some embodiments, as shown in FIGS. 2 and 3, the reticle stage 43 includes an acoustic wave transducer 435 disposed around the central region C and corresponding to an edge of the reticle M. When the reticle M is secured on the chuck surface 431A and supported by the protruding burls 433 (see FIG. 3), the acoustic wave transducer 435 on the chuck surface 431A is located below the edge of the reticle M. Although not clearly shown, at least a portion or the entire acoustic wave transducer 435 is placed within the projected area of the reticle M on the chuck surface 431A in various embodiments.

In some embodiments, there is vertical distance Z (see FIG. 4), such as about 1.0 μm to about 10 μm, between the surface of the acoustic wave transducer 435 and the top of each burl 433 (i.e., between the acoustic wave transducer 435 and chucked surface S2 of the reticle M). If the vertical distance is less than 1.0 μm, the generated surface acoustic wave can easily damage the edge of the reticle M. If the vertical distance is greater than 10 μm, the electrostatic attraction force may not be enough to secure the reticle M as desired. In one particular example, the vertical distance Z is about 2 μm.

Figure 5:
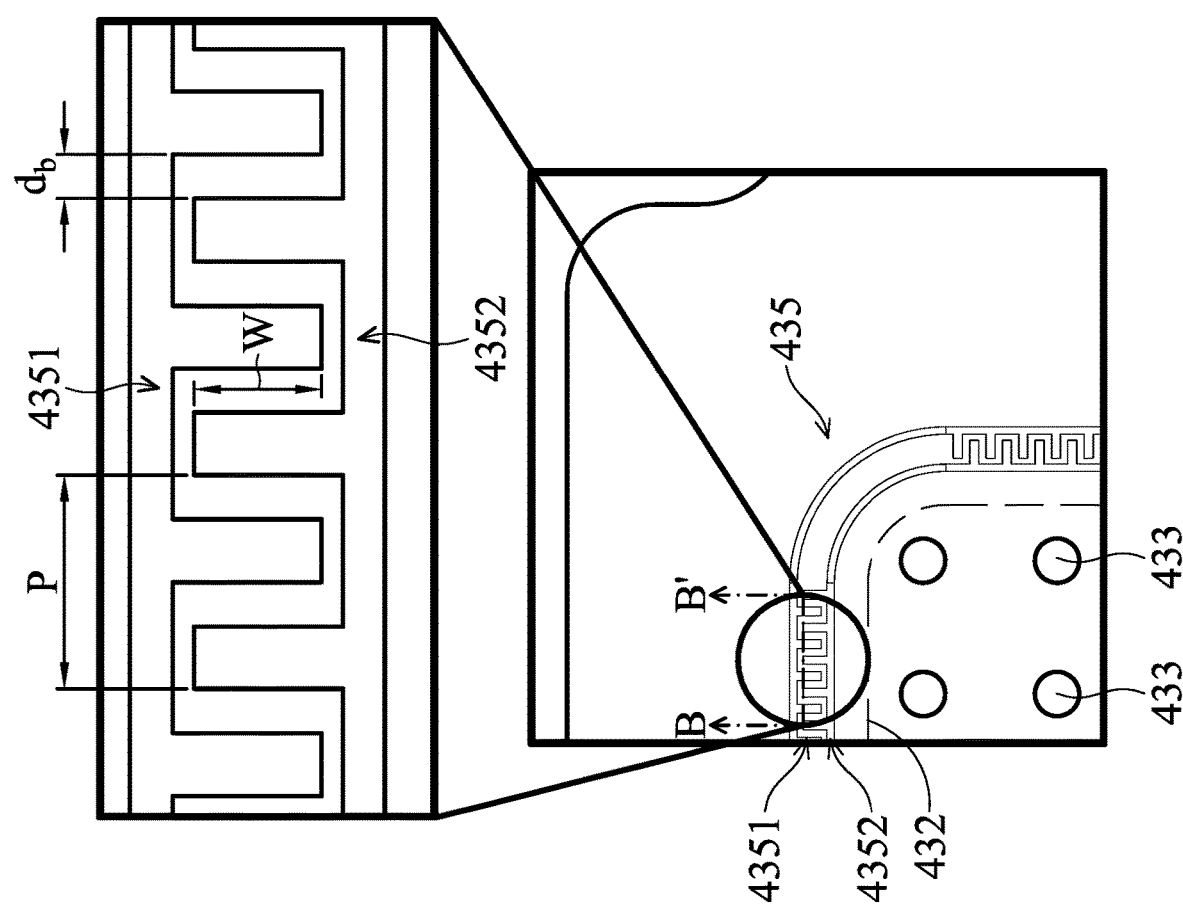
FIG. 5 is a schematic view showing the configuration of a part of the acoustic wave transducer in FIG. 2.
Figure 6:
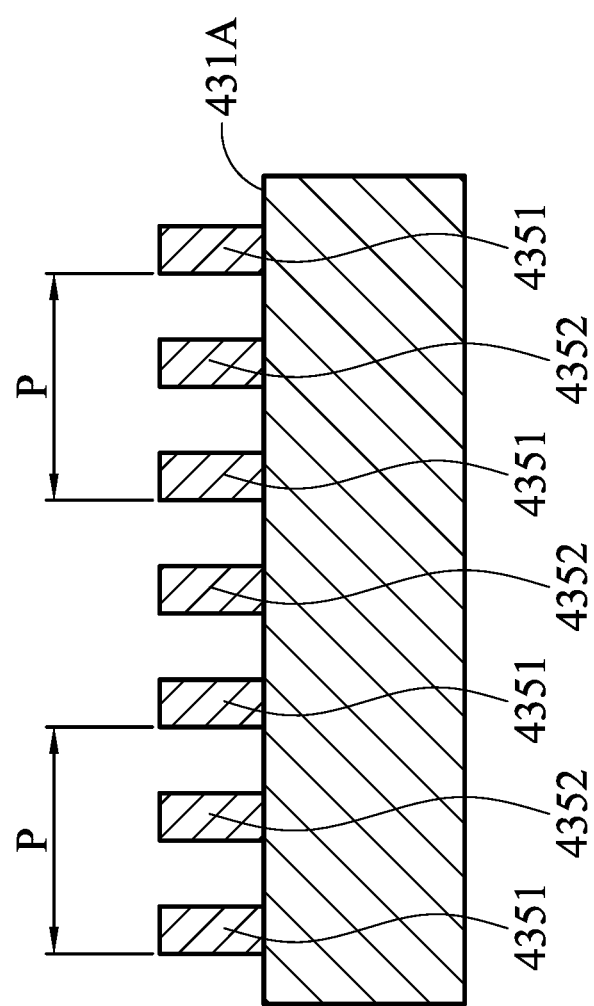
FIG. 6 is a cross-sectional view taken along the line B-B' in FIG. 5.

FIG. 5 is a schematic view showing the configuration of a part of the acoustic wave transducer 435 in FIG. 2. FIG. 6 is a cross-sectional view taken along the line B-B' in FIG. 5. In some embodiments, the acoustic wave transducer 435 is an interdigital transducer including two interlocking comb-shaped arrays of metallic electrodes 4351 and 4352 (in the fashion of a zipper).

The reticle stage 43 also includes a power supply 436 (see FIG. 2) configured to apply a voltage between the metallic electrodes 4351 and 4352. In some embodiments, the power supply 436 provides an AC (alternating-current) electrical signal at a given voltage (e.g., up to about 1 kV) and at a given frequency (e.g., about 1 megahertz (MHz) to about 1 gigahertz (GHz)) to the metallic electrodes 4351 and 4352. Other values of voltage and frequency of the supplied electrical signal can also be used. The acoustic wave transducer 435 converts the electrical signal outputted from the power supply 436 to an acoustic signal (i.e., surface acoustic wave).

The pitch P (see FIGS. 5 and 6) between two neighboring metallic electrodes 4351/4352 on the same side determines the wavelength of the generated surface acoustic wave. For example, the frequency $f_0$ of the acoustic wave transducer 435 may satisfy the following equation:

$$f_0 = V_P/P$$

wherein $V_p$ is the phase velocity and P is the pitch between the two neighboring metallic electrodes 4351/4352 on the same side.

If the phase velocity (Vp) is determined (depending on the material of dielectric body 431) and the frequency (f0) is chosen, the pitch P can be determined. In some embodiments, as shown in FIGS. 5 and 6, the pitch P is in a range of about 0.1 μm to about 5000 μm. Also, the space db between two neighboring metallic electrodes 4351 and 4352 on different sides will be obtained as the pitch P is determined. In some embodiments, the space db is in a range of about 0.1 μm to about 5000 μm. In addition, the distance W between the ends of two metallic electrodes 4351 and 4352 affects the amplitude of the generated surface acoustic wave. For example, the larger the distance W, the larger the amplitude of the surface acoustic wave. In some embodiments, the distance W between the ends of two metallic electrodes 4351 and 4352 is in a range of about 50 μm to about 1 cm.

In some embodiments, the acoustic wave transducer 435 is directly electrically connected to the chuck surface 431A of the dielectric body 431. The metallic electrode 4351 and 4352 of the acoustic wave transducer 435 may be formed on the dielectric body 431 by a suitable manner. In some embodiments, the dielectric body 431 may be made of piezoelectric material, such as crystal, ceramic, and polymer material. Alternatively, the dielectric body 431 may be made of other material such as polymer material such as quartz (SiO2), Zirconium Titanate, BaiO3, ceramic, and Polyvinylidene Fluoride.

The surface acoustic wave generated by the acoustic wave transducer 435 may cause the crystal lattice within a certain thickness (e.g., about 2 mm) below the chuck surface 431A of the dielectric body 431 to vibrate. Moreover, vibration of the chuck surface 431A underlying the reticle M causes the reticle M to be removed from the chuck surface 431A (as the arrow indicated in FIG. 4), for example, after the electrostatic attraction of the reticle stage 43 is released.

Figure 7:
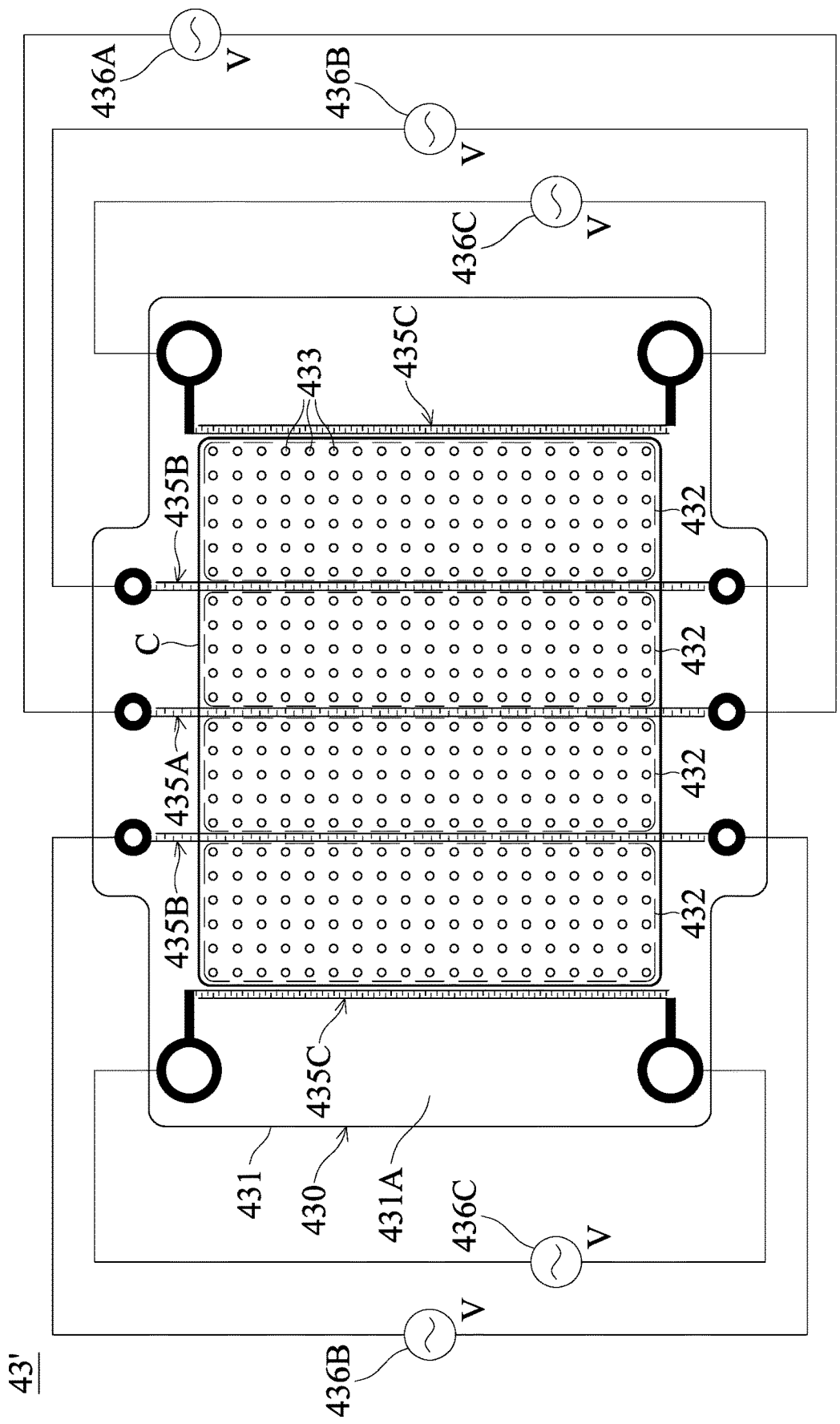
FIG. 7 is a perspective view of a reticle stage, in accordance with some embodiments.

Many variations and modifications can be made to embodiments of the disclosure. For example, FIG. 7 is a perspective view of another reticle stage 43', in accordance with some embodiments. The reticle stage 43' differs from the reticle stage 43 described above in that multiple acoustic wave transducers 435A, 435B and 435C (each having the same structure as the acoustic wave transducer 435 of the above embodiments) are disposed on and electrically connected to the chuck surface 431A of the dielectric body 431.

As shown in FIG. 7, the reticle stage 43' includes an acoustic wave transducer 435A configured to pass through the central region C of the dielectric body 431, two acoustic wave transducers 435C disposed on opposite sides of the central region C, and two acoustic wave transducers 435B disposed between the acoustic wave transducer 435A and 435C. Each acoustic wave transducer 435A or 435B passing through the central region C may be positioned corresponding to a gap between two neighboring chucking electrodes 432 in order to avoid interfering with the chucking electrodes 432. In some embodiments, each acoustic wave transducer 435A/435B/435C is placed within the projected area of the reticle M (not shown in FIG. 7) on the chuck surface 431A. The number and location of the acoustic wave transducers can also vary in different embodiments.

Furthermore, the reticle stage 43' also includes a number of power supplies 436A, 436B and 436C each configured to apply a voltage between the metallic electrodes of each acoustic wave transducer 435A/435B/435C. For example, in some embodiments as shown in FIG. 7, one power supply 436A is provided to apply a voltage between the metallic electrodes of the acoustic wave transducer 435A (that corresponds to the central part of the reticle M), two power supplies 436C are provided to respectively apply a voltage between the metallic electrodes of each acoustic wave transducer 435C (that corresponds to an edge part of the reticle M), and two power supplies 436B are provided to respectively apply a voltage between the metallic electrodes of each acoustic wave transducer 435B.

In some embodiments, the electrical signals from the power supplies 436A, 436B and 436C are the same. Alternatively, the electrical signals from the power supplies 436A, 436B and 436C may be different either in voltage or frequency. In some embodiments, the surface acoustic waves generated by the acoustic wave transducers 435A, 435B and 435C have the same amplitude and frequency. In some alternative embodiments, the surface acoustic waves generated by the acoustic wave transducers 435A, 435B and 435C have different amplitudes and/or frequencies.

Figure 8:
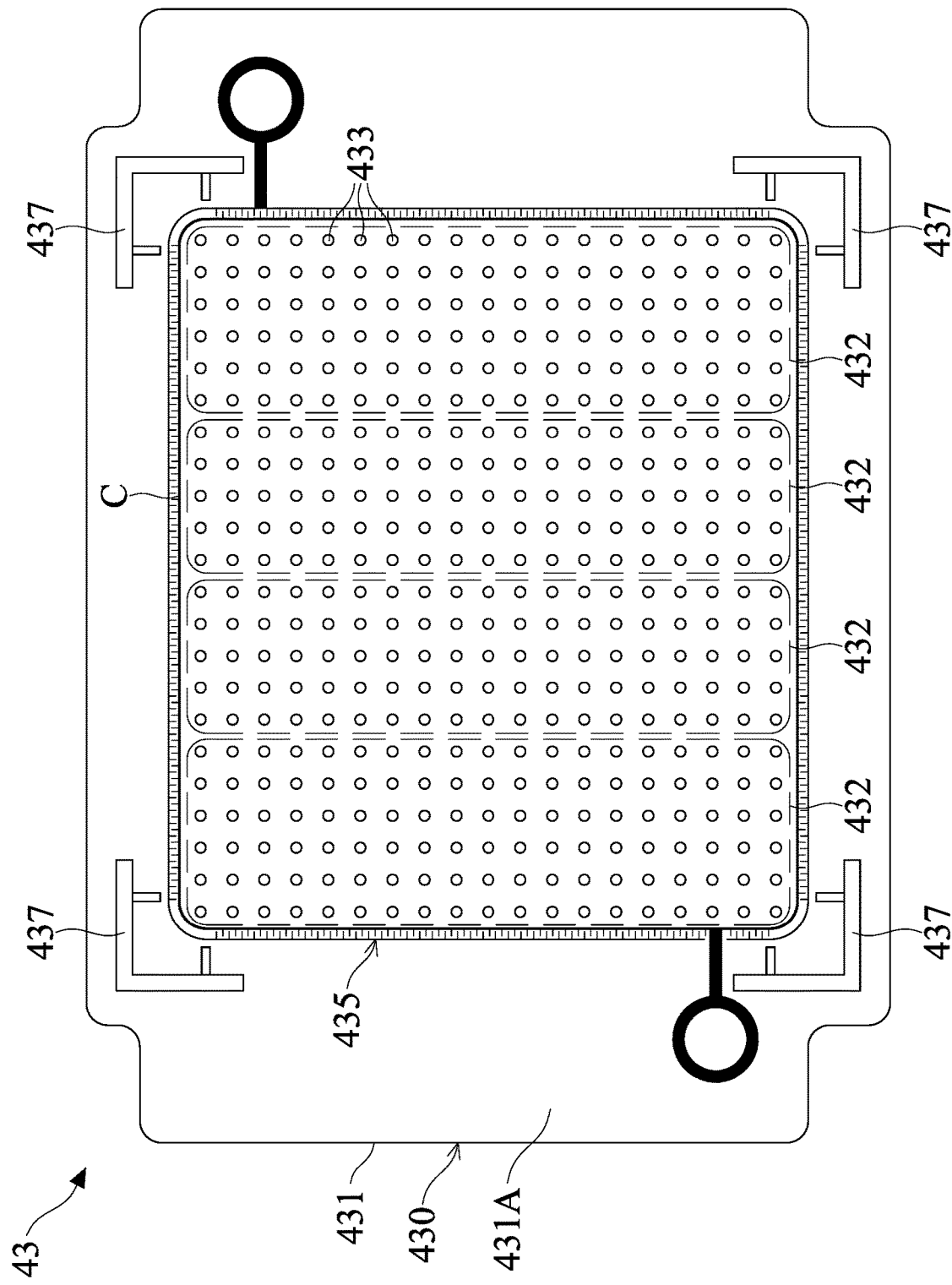
FIG. 8 is a schematic view showing multiple reticle positioning members disposed on the chuck surface of the electrostatic chuck, in accordance with some embodiments.

Next, referring to FIG. 8, in some embodiments, multiple reticle positioning members 437 are further disposed on the chuck surface 431A of the electrostatic chuck 430 and positioned outside the central region C (e.g., corresponding to the corners of the reticle M (not shown)). The reticle positioning members 437 are configured to prevent the reticle M from moving horizontally relative to the chuck surface 431A. In some embodiments, each of the reticle positioning members 437 includes a clip structure or limiting mechanism. The reticle positioning members 437 may each have a larger thickness than the reticle M.

Figure 9:
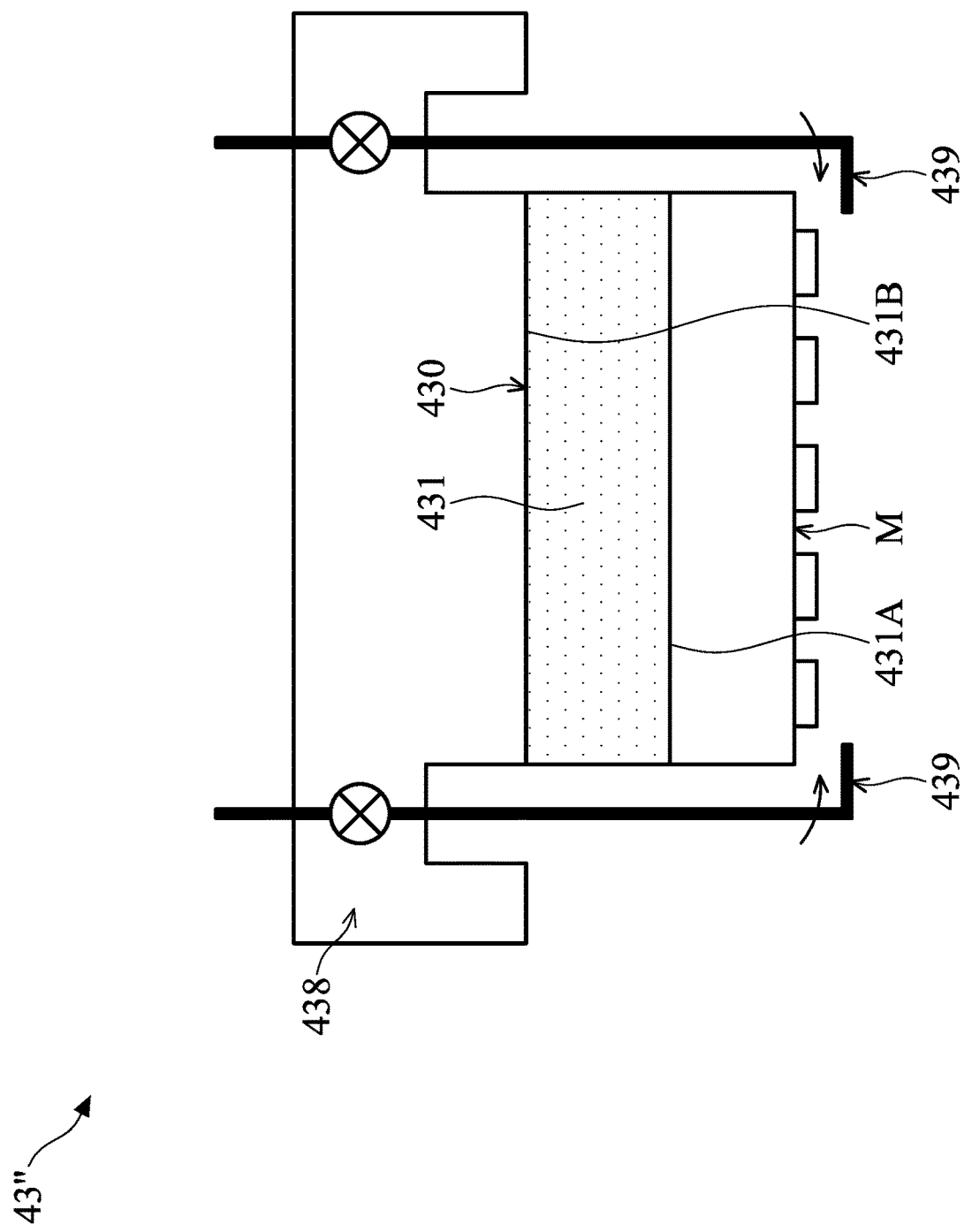
FIG. 9 is a schematic side view of a reticle stage, in accordance with some embodiments.

FIG. 9 is a schematic side view of another reticle stage 43", in accordance with some embodiments. In some embodiments, in addition to the electrostatic chuck 430, the reticle stage 43" further includes a base plate 438 connected to the base surface 431B of the dielectric body 431 of the electrostatic chuck 430. Also, multiple clamping mechanisms 439 may be operably installed on the base plate 438 and configured to extend to the edge of the reticle M. For example, when the reticle M is clamped on the reticle stage 43" by electrostatic attraction, the clamping mechanisms 439 may be operated to move toward the edge of the reticle M (as the arrows indicated in FIG. 9) so as to prevent from the reticle M from falling undesirably from the reticle stage 43". On the other hand, the clamping mechanisms 439 may also be operated to move away from the edge of the reticle M before the reticle M is to be removed from the reticle stage 43".

Referring back to FIG. 1, the EUV lithography system 40 may further include other modules or be integrated with (or be coupled with) other modules. For example, the EUV lithography system 40 also includes a gas supply module 46 designed to provide hydrogen gas ($H_2$) to the radiation source 41. The hydrogen gas helps reduce contamination in the radiation source 41. The elements of the EUV lithography system 40 can be added or omitted, and the invention should not be limited by the embodiments.

In some embodiments, the semiconductor substrate processing system 1 further includes a control module 50 configured for controlling the operation of modules of the semiconductor substrate processing system 1. In some embodiments, the control module 50 is a computer that communicates with various modules of the semiconductor substrate processing system 1 by a wired or wireless communication network. For example, the control module 50 is electrically connected to the transferring module 20, the switching module 30, and the EUV lithography system 40.

The operation of the transferring module 20, the switching module 30, and the EUV lithography system 40 is controlled by the control module 50.

Figure 10:
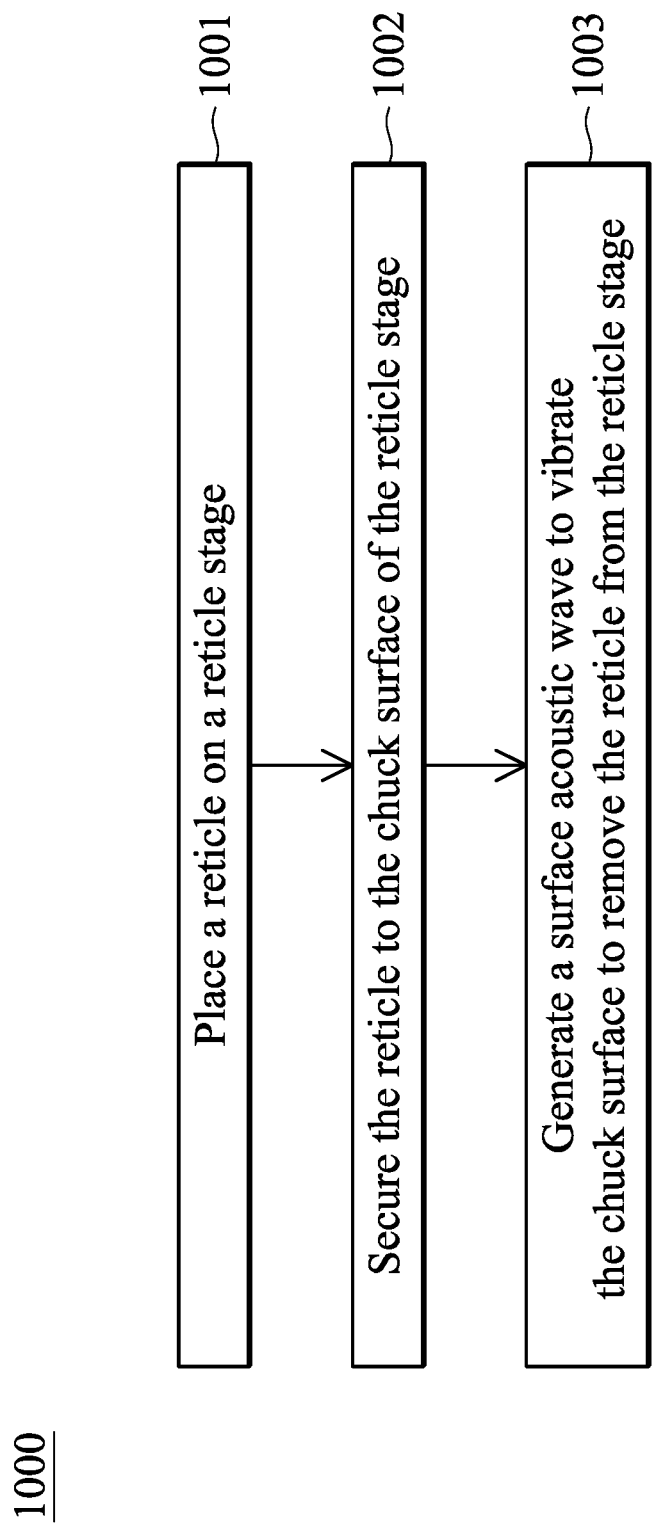
FIG. 10 is a simplified flowchart of a method of transporting a reticle by a reticle stage, in accordance with some embodiments.

FIG. 10 is a simplified flowchart of a method 1000 of transporting a reticle by a reticle stage, in accordance with some embodiments. Some of the described operations can be replaced or eliminated in different embodiments, and additional operations can be provided before, during, and after the method.

The method 1000 begins with operation 1001, in which the reticle M is placed on the reticle stage (e.g., the reticle stage 43 shown in FIGS. 2-6). In some embodiments, in order to deliver the reticle M held by the robotic arm 31 of the switching module 30 to the processing module 40 (also referred to as EUV lithography system 40) for lithography exposure processing, the reticle stage 43 is first moved to a loading position P1 as shown in FIG. 1. In the loading position e P1, the reticle stage 43 is positioned above the reticle M, and the chuck surface 431A contacts the chucked surface S2 of the reticle M. In some other embodiments, the reticle stage 43 can also be replaced with the reticle stage 43' or 43" (see FIGS. 7-9).

The method 1000 continues to operation 1002, in which the reticle M is fixed to the chuck surface 431A of the reticle stage 43. In some embodiments, as shown in FIGS. 1-3, the chucking electrodes 432 of the reticle stage 43 provide electrostatic attraction to secure the reticle M to the chuck surface 431A. Then the reticle M is moved by the reticle stage 43 to a processing position P2 above the semiconductor substrate W for subsequent lithography processing. After the lithography process, the reticle stage 43 is moved to an unloading position in order to deliver the reticle M back to the robotic arm 31. During transportation, the reticle M is secured on the chuck surface 431A by electrostatic attraction.

Figure 4:
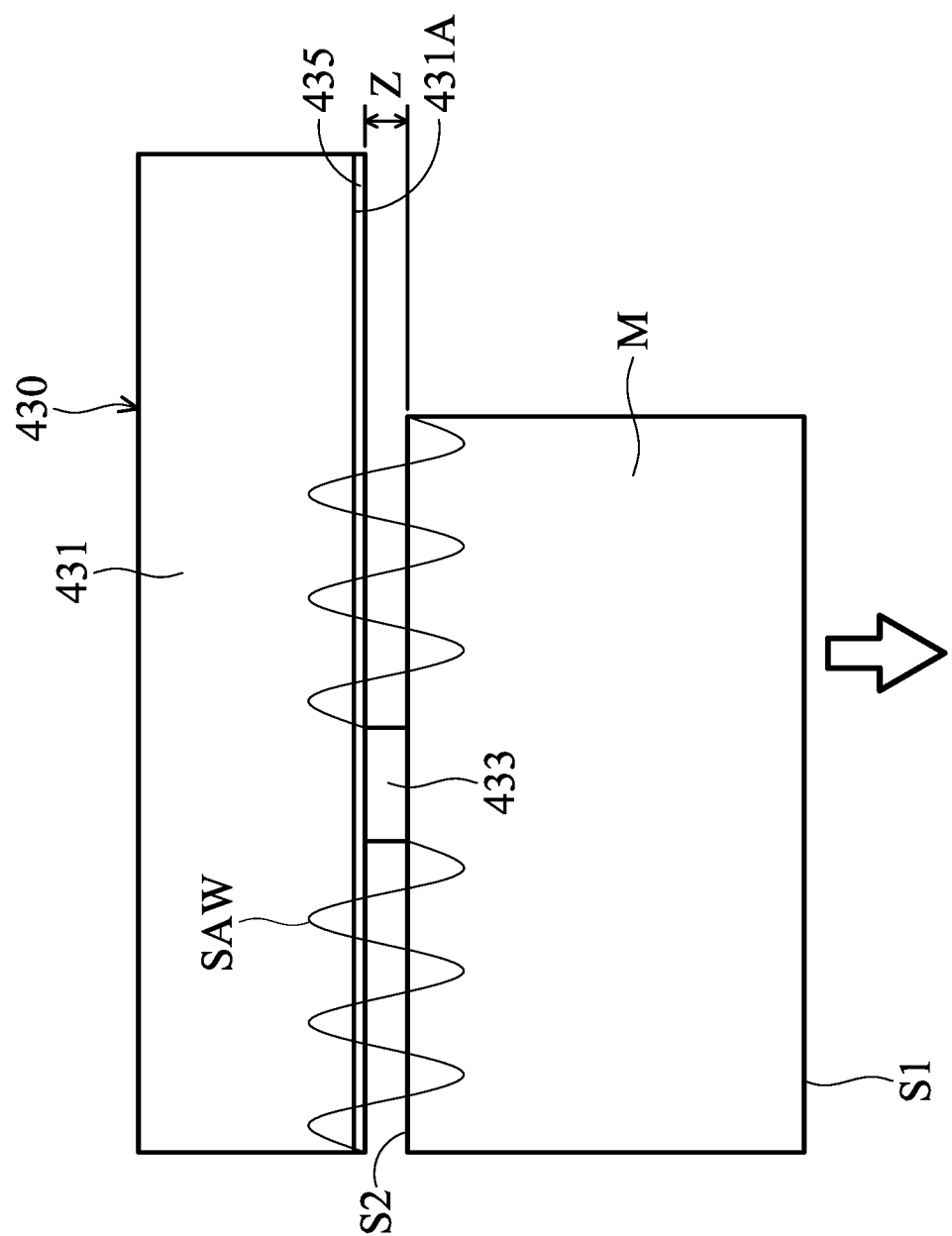
FIG. 4 is a schematic side view showing that the acoustic wave transducer imparts a surface acoustic wave to the chuck surface of the electrostatic chuck.

The method 1000 continues to operation 1003, in which the reticle M is removed from the reticle stage 43. In some embodiments, as shown in FIG. 4, at least one acoustic wave transducer 435 disposed on the chuck surface 431A can generate an acoustic wave (e.g., a surface acoustic wave) in response to the electrical signal from the power supply 436 to vibrate the chuck surface 431A, thereby removing the reticle M from the reticle stage 43, for example, after the electrostatic attraction is released.

In some embodiments, as shown in FIGS. 2-5, the acoustic wave transducer 435 may generate a surface acoustic wave around the reticle M on the chuck surface 431A so as to remove the reticle M from the reticle stage 43.

In some embodiments, as shown in FIG. 7, the acoustic wave transducers 435A, 435B and 435C may generate at least one first surface acoustic wave corresponding to the central part of the reticle M and generate at least one second surface acoustic wave corresponding to the edge part of the reticle M on the chuck surface 431A so as to remove the reticle M from the reticle stage 43.

In some embodiments, the generated first surface acoustic wave and second surface acoustic wave have the same or different frequencies. In some embodiments, the generated first surface acoustic wave and second surface acoustic wave have the same or different amplitudes. For example, the generated first surface acoustic wave (corresponding to the central part of the reticle M) may have a larger amplitude and a higher frequency than the generated second surface acoustic wave, so as to successfully remove the reticle M from the reticle stage 43.

In some embodiments, the vibration range of the chuck surface 431A caused by the surface acoustic wave is less than about 20 µm. In such way, the reticle M can be removed safely without causing damage to the reticle M (e.g., colliding with the reticle positioning members 437 shown in FIG. 8).

After the reticle M is removed from the reticle stage 43, it can be sent out of the semiconductor substrate processing system 1 in a suitable manner for further processing or storage.

The embodiments of the present disclosure have some advantageous features: by disposing at least one acoustic wave transducer on the chuck surface of the reticle stage and generating a surface acoustic wave by the acoustic wave transducer to vibrate the chuck surface, the reticle can be removed safely and quickly from the reticle stage. Furthermore, since the reticle stage does not use gases to secure or remove the reticle, it reduces the chance of the particles within the EUV lithography system falling on the reticle (it should also be understood that the reticle stage may also be used in other types of lithography systems or other processing modules). As a result, the yield of the lithography process is also improved.

In some embodiments, a reticle stage is provided, including an electrostatic chuck and an acoustic wave transducer. The electrostatic chuck includes multiple chucking electrodes embedded in a dielectric body and is configured to secure a reticle to a chuck surface of the dielectric body by electrostatic attraction. The acoustic wave transducer is disposed on the chuck surface and configured to impart a surface acoustic wave to the chuck surface to vibrate the chuck surface, thereby removing the reticle from the reticle stage.

In some embodiments, a method of transporting a reticle by a reticle stage is provided. The method includes placing the reticle on the reticle stage. The reticle stage includes an electrostatic chuck including a plurality of chucking electrodes embedded in a dielectric body and at least one acoustic wave transducer disposed on a chuck surface of the dielectric body. The method also includes providing electrostatic attraction using the chucking electrodes to secure the reticle to the chuck surface during transportation. In addition, the method includes generating a surface acoustic wave by the acoustic wave transducer to vibrate the chuck surface, thereby removing the reticle from the reticle stage.

In some embodiments, a reticle stage is provided, including an electrostatic chuck, an acoustic wave transducer, and a power supply. The electrostatic chuck includes multiple chucking electrodes embedded in a dielectric body and is configured to secure a reticle to a chuck surface of the dielectric body by electrostatic attraction. The acoustic wave transducer is electrically connected to the chuck surface. The power supply is configured to provide an electrical signal to the acoustic wave transducer. The acoustic wave transducer generates an acoustic wave in response to the electrical signal from the power supply to vibrate the chuck surface, thereby removing the reticle from the reticle stage.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may vary while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A reticle stage, comprising:
    an electrostatic chuck comprising a plurality of chucking electrodes embedded in a dielectric body, wherein the electrostatic chuck is configured to secure a reticle to a chuck surface of the dielectric body by electrostatic attraction, wherein the electrostatic chuck further comprises a plurality of protruding burls formed on the chuck surface and in a central region of the chuck surface to support the reticle; and
    an acoustic wave transducer disposed on the chuck surface and configured to impart a surface acoustic wave to the chuck surface to vibrate the chuck surface, thereby removing the reticle from the reticle stage, wherein the acoustic wave transducer is configured to pass through the central region.

2. The reticle stage as claimed in claim 1, wherein the acoustic wave transducer is an interdigital transducer comprising two interlocking comb-shaped arrays of metallic electrodes.

3. The reticle stage as claimed in claim 2, further comprising a power supply configured to apply a voltage between the metallic electrodes.

4. The reticle stage as claimed in claim 2, wherein a pitch between two neighboring metallic electrodes on the same side determines a wavelength of the surface acoustic wave.

5. The reticle stage as claimed in claim 1, wherein the acoustic wave transducer is electrically connected to the chuck surface.

6. The reticle stage as claimed in claim 5, wherein the dielectric body comprises piezoelectric material.

7. The reticle stage as claimed in claim 1, wherein a vertical distance between a surface of the acoustic wave transducer and a top of each burl is between about 1.5 µm and about 3 µm.

8. The reticle stage as claimed in claim 1, further comprising a second acoustic wave transducer disposed around the central region and corresponding to an edge of the reticle.

9. The reticle stage as claimed in claim 1, wherein the acoustic wave transducer is positioned corresponding to a gap between two neighboring chucking electrodes.

10. The reticle stage as claimed in claim 1, wherein the electrostatic chuck further comprises a plurality of reticle positioning members disposed on the chuck surface and positioned outside the central region.

11. The reticle stage as claimed in claim 1, wherein the electrostatic chuck further comprises a base plate connected to a base surface of the dielectric body opposite the chuck surface, and a plurality of clamping mechanisms are operably installed on the base plate and configured to extend to an edge of the reticle.

12. A method of transporting a reticle by a reticle stage, comprising:
    placing the reticle on the reticle stage, wherein the reticle stage comprises an electrostatic chuck comprising a plurality of chucking electrodes embedded in a dielectric body and at least one acoustic wave transducer disposed on a chuck surface of the dielectric body, wherein the at least one acoustic wave transducer comprises a first acoustic wave transducer disposed to correspond to a central part of the reticle;
    providing electrostatic attraction using the chucking electrodes to secure the reticle to the chuck surface during transportation; and
    generating a first surface acoustic wave corresponding to the central part of the reticle on the chuck surface by the first acoustic wave transducer to vibrate the chuck surface, thereby removing the reticle from the reticle stage.

13. The method as claimed in claim 12, wherein the at least one acoustic wave transducers further comprises a second acoustic wave transducer disposed to correspond to an edge part of the reticle, and the method further comprises generating a second surface acoustic wave corresponding to the edge part of the reticle on the chuck surface using the second acoustic wave transducer to remove the reticle from the reticle stage.

14. The method as claimed in claim 13, wherein the first surface acoustic wave and the second surface acoustic wave have different frequencies.

15. The method as claimed in claim 13, wherein the first surface acoustic wave and the second surface acoustic wave have different amplitudes.

16. The method as claimed in claim 13, wherein the first and second acoustic wave transducers are placed within a projection area of the reticle on the chuck surface.

17. The method as claimed in claim 13, wherein the first surface acoustic wave has a larger amplitude and a higher frequency than the second surface acoustic wave.

18. The method as claimed in claim 12, wherein a vibration range of the chuck surface caused by the first surface acoustic wave is less than about 20 µm.

19. A reticle stage, comprising:
    an electrostatic chuck comprising a plurality of chucking electrodes embedded in a dielectric body, wherein the electrostatic chuck is configured to secure a reticle to a central region of a chuck surface of the dielectric body by electrostatic attraction; and
    an acoustic wave transducer electrically connected to the chuck surface and configured to pass through the central region, wherein the acoustic wave transducer configured to generate an acoustic waver to vibrate the chuck surface, thereby removing the reticle from the reticle stage.

20. The method as claimed in claim 19, wherein the acoustic wave transducer is positioned corresponding to a gap between two neighboring chucking electrodes.

* * * * *